United States Patent [19]
Nagafuji

[11] Patent Number: 5,834,833
[45] Date of Patent: Nov. 10, 1998

[54] ELECTRICAL COMPONENT HAVING A SELECTIVE CUT-OFF CONDUCTOR

[75] Inventor: Toshiaki Nagafuji, Tokyo, Japan

[73] Assignee: NEC Corporation, Japan

[21] Appl. No.: 811,525

[22] Filed: Mar. 4, 1997

[30] Foreign Application Priority Data

Mar. 21, 1996 [JP] Japan ................................. 8-064079

[51] Int. Cl.⁶ .......................... H01L 23/02; H01L 23/48; H01L 23/12; H01H 9/02
[52] U.S. Cl. .......................... 257/678; 257/693; 257/701; 257/702; 174/50; 174/58; 438/15; 438/25; 438/26
[58] Field of Search .................... 257/692, 693, 257/698, 678, 659, 660, 728, 701–707; 361/820, 731, 733, 729; 29/740; 174/50, 58; 438/15, 25, 26, 64, 106

[56] References Cited

U.S. PATENT DOCUMENTS

| | | | |
|---|---|---|---|
| 4,631,572 | 12/1986 | Zimmerman | 257/701 |
| 4,710,250 | 12/1987 | Kojima et al. | 257/701 |
| 5,126,818 | 6/1992 | Takami et al. | 257/701 |
| 5,258,648 | 11/1993 | Lin | 257/778 |

FOREIGN PATENT DOCUMENTS

| | | | |
|---|---|---|---|
| 57-136723 | 8/1982 | Japan . | |
| 62-66512 | 3/1987 | Japan | H01H 11/00 |
| 62-150874 | 9/1987 | Japan . | |
| 62-169475 | 10/1987 | Japan | H01R 11/01 |
| 63-172065 | 11/1988 | Japan | H01R 11/01 |
| 1-89473 | 6/1989 | Japan | H01R 11/01 |
| 189473 | 6/1989 | Japan . | |
| 3-13667 | 2/1991 | Japan | H01R 9/09 |
| 313667 | 2/1991 | Japan . | |

Primary Examiner—Mahshid D. Saadat
Assistant Examiner—Jhihan B. Clark
Attorney, Agent, or Firm—Hayes, Soloway, Hennessey, Grossman & Hage, P.C.

[57] ABSTRACT

An electrical component has a chip body made of resin, and a metallic pattern including a plurality of terminals to be bonded to a printed circuit, a plurality of interconnects extending on the top surface and connected to the terminals. The chip body has a plurality of small thickness region each corresponding to one of the interconnects. Each of the small thickness regions can be selectively broken after bonding the chip body onto a printed circuit board by a thrusting tool for disconnection. The chip body can provide a desired function of the electronic circuit after fabrication of an electronic device.

11 Claims, 5 Drawing Sheets

ELECTRICAL COMPONENT HAVING A SELECTIVE CUT-OFF CONDUCTOR

BACKGROUND OF THE INVENTION (a) Field of the Invention

The present invention relates to an electrical component having a selective cut-off conductor and, more particularly, to component having a metal pattern thereon capable of being selectively cut-off after mounting the component onto a printed circuit board for connection.

(b) Description of the Related Art

A recent development for electronic circuits including an LSI enables the electronic circuits to be added by a specified function after fabrication of the electronic circuits. The addition of the function may be executed by a selective cut-off of a conductor in an electrical component to be mounted on a printed circuit board for connection in the printed circuit.

FIG. 1 shows an example of a selective cut-off conductor described in Utility Model (UM) Publication No. JP-A-1987-169475, wherein the selective cut-off conductor is implemented by a metallic stripe plate 51 having a central narrowed portion 52 disposed in spaced relationship with the surface of a printed circuit board. The central portion 52 can be cut-off by a nipper 53, if desired, after bonding the stripe conductor onto the printed circuit board.

FIGS. 2 and 3 show another example of a selective cut-off conductor in a combination switch described in Patent Publication No. JP-A-1987-66512. FIG. 2 shows a metallic pattern 101 of a combination switch, and FIG. 3 shows a mold insulator 102 covering the metallic pattern 101. The metallic pattern 101 is connected to terminals 104A and 104*b* each constituting a stationary contact of a push button switch. Specified portions 101A and 101B of the metallic pattern 101 are selectively cut-off at the openings 103A and 103B of the mold insulator 102, and specified portions 106A and 106*b* are also cut-off from outside the combination switch to provide two separate switches from the combination switch.

Other components each having a selective cut-off conductor are also described in UM Publications No. JP-A-1991-13667 which shows a conductive pattern connecting both terminals of the component; No. JP-A-1988-172065 which shows a branch jumper, and No. JP-A-1989-89473 which shows a component having an internal lead connecting terminals disposed in the vicinity of opposite apexes of the electrical component.

SUMMARY OF THE INVENTION

It is an object of the present invention to provide a new electrical component suitable for a large scale of fabrication and having a selective cut-off conductor which can be cut-off in a time-efficient manner.

In accordance with the present invention, there is provided an electrical component comprising a body having a top surface, a bottom surface and a side surface, and a metallic pattern including a plurality of terminals formed on or in the vicinity of the bottom surface and a plurality of interconnects formed at least on the top surface and electrically connected to the terminals where the body has a small thickness region on the top surface in alignment with one of the interconnects, the small thickness region having a thickness smaller than a thickness of adjacent regions adjacent to said small thickness region.

In accordance with the electrical component of the present invention, the small thickness region can be thrust away for selectively cutting-off the interconnects on the top surface in a time-efficient manner. Also, the body of the present invention is formed substantially of a single material. Accordingly, the component is suited for large scale fabrication of electronic devices.

The above and other objects, features and advantages of the present invention will be more apparent from the following description, referring to the accompanying drawings.

DESCRIPTION OF THE PREFERRED EMBODIMENTS

Figure 1:
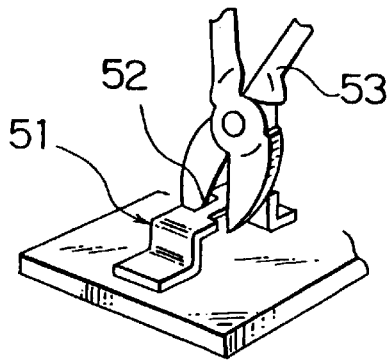
FIG. 1 is a perspective view of a conventional selective cut-off conductor on a printed circuit board.
Figure 2:
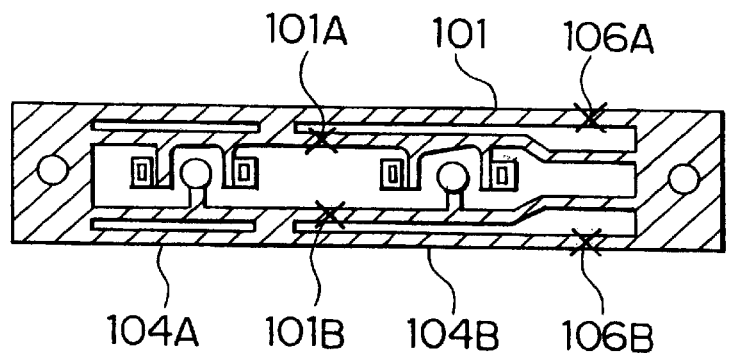
FIG. 2 is a plan view of a conventional selective cut-off conductor in a combination switch.
Figure 3:
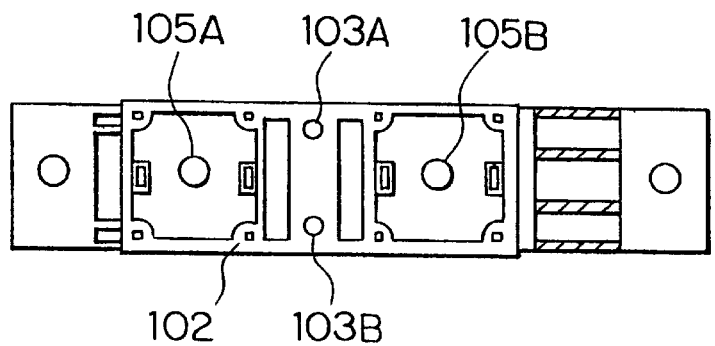
FIG. 3 is a plan view of a mold insulator covering the selective cut-off conductor of FIG. 2.

Now, the present invention will be described in more detail with reference to the accompanying drawings, wherein similar constituent elements are designated by the same reference numerals throughout the drawings.

Figure 4:
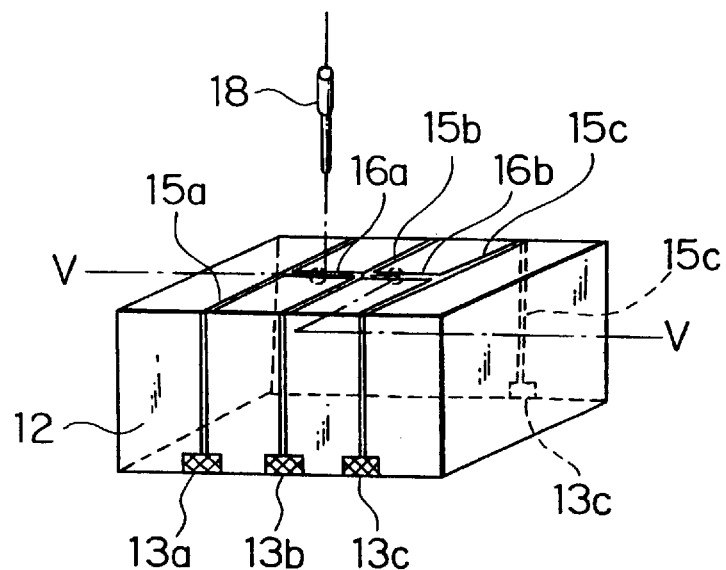
FIG. 4 is a perspective view of an electrical component having a selective cut-off conductor according to a first embodiment of the present invention.

Referring to FIG. 4, an electrical component according to a first embodiment of the present invention comprises a body 12 having a shape of a hexahedron, or a rectangular prism, and a metallic pattern formed thereon. The body 12 is made of a resin, such as a liquid crystal polymer, capable of being plated by a metal. The metallic pattern formed by plating includes a plurality of (three in this case) pairs of terminals 13*a*, 13*b*, and 13*c*, each pair of terminals, for example, terminals 13*c* and 13*c* being disposed opposite to each other. The metallic pattern further includes a plurality of first interconnects 15*a*, 15*b* and 15*c* each extending from one of the opposite side surfaces through the top surface to the other of the opposite side surfaces of the body 12 to connect a corresponding pair of terminals together, and a plurality of second interconnects 16a and 16b each extending on the top surface of the body 12 perpendicular to the plurality of first interconnects 15a, 15b and 15b for connecting two of the first interconnects together. The plurality of terminals 13a, 13b and 13c are arranged on bottom edges of opposite side surfaces, or in the vicinity of the bottom surface, to be soldered to respective terminals formed on a printed circuit board or a package mounting the body 12.

Figure 5:
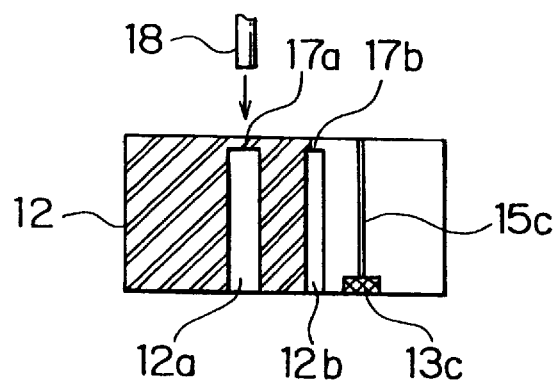
FIG. 5 is a cross-sectional view of the component of FIG. 4 taken along a vertical plane passing line 5—5 in FIG. 4.

Referring to FIG. 5 showing the cross-section of the body 12 in FIG. 4, the body 12 has a plurality of slots 12a and 12b each having an opening at the bottom surface of the body 12 and a bottom near the top surface of the body 12 below a corresponding one of the second interconnects. The locations of the slots 12a and 12b are specified by dotted circles on the top surface of the body 12 in FIG. 4. In this configuration, each second interconnect 16a or 16b connecting two of the first interconnects 15a, 15b and 15c is disposed on a small thickness region 17a or 17b of the chip body 12.

After, the body 12 is mounted on a printed circuit board, selected second interconnect 16a or 16b is broken together with the corresponding small thickness region 17a or 17b, by thrusting the small thickness region 17a or 17b by a thrusting tool 18, thereby disconnecting the two of the first interconnects. Upon breaking the small thickness region 17a or 17b, it is desirable to remove fine particles generated by the destruction of the small thickness region. The removal can be implemented by a vacuum suction nozzle, not shown, carried together with the thrusting tool 18. By this configuration, a reliable disconnection between the first interconnects can be obtained by assuring a sufficient distance for the removed small thickness region.

Figure 6:
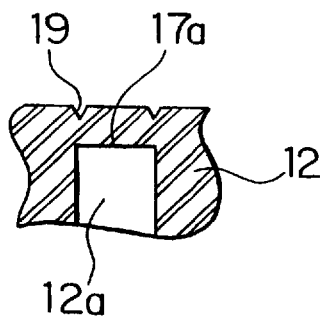
FIG. 6 is an enlarged partial, cross-sectional view of the component of FIG. 5.

The small thickness region, as shown in FIG. 6, may have notches 19 on the top surface of the body 12 at the edges of the small thickness region 17a to allow a reliable removal of the small thickness region 17a. The configuration of the pair of terminals 13a, 13b and 13c disposed on opposite side surfaces of the body 12 provides, after soldering onto a printed circuit board, reliable connections between interconnects formed on the printed circuit board.

Figure 7:
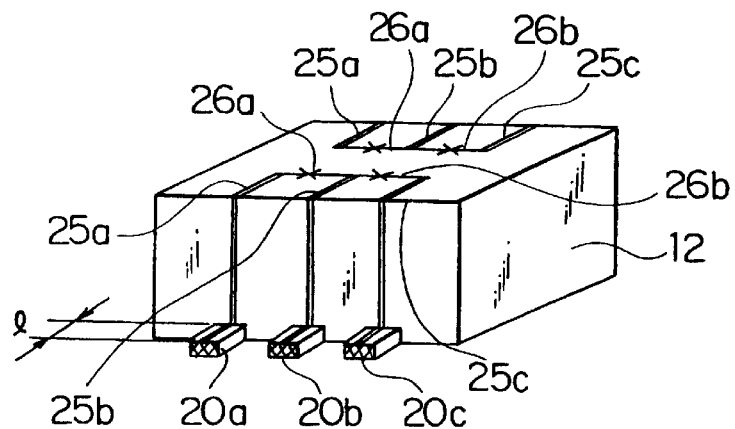
FIG. 7 is a perspective view of a chip component having a selective cut-off conductor according to a second embodiment of the present invention.

FIG. 7 shows an electrical component according to a second embodiment of the present invention. The component has a body 12 similar to the body in the first embodiment, and a metallic pattern including six terminals 20a, 20b and 20c disposed at the bottom edges of the opposite side surfaces of the body 12 and horizontally protruding from the side surfaces, and two interconnect groups each for connecting three of the terminals disposed on one of the opposite side surfaces together. Each of the interconnect groups includes three first interconnects 25a, 25b and 25c extending parallel to one another from a corresponding one of the terminals 20a, 20b and 20c to the top surface of the body 12 and second interconnects 26a and 26b for connecting the first interconnects 25a, 25b and 25c together. The second interconnects 26a and 26b have respective selective cut-off portions, as shown by "x" in the drawing, similarly to the first embodiment, at the small thickness regions of the body 12. The second interconnects 26a and 26b can be selectively cut-off using the thrusting tool 18 shown in FIG. 4.

The terminals 20a, 20b and 20c protrude from the side surface by a length "l" parallel to the surface of the printed circuit board mounting the electrical component. The protruding terminals 20a, 20b and 20c provide flexibility of the bonding between the body 12 and the printed circuit board. Generally, the thermal expansion coefficients of both the body 12 and the printed circuit board are significantly different from each other, causing thermal stress within the solder due to the heat cycle applied to the electronic device. The protruding terminals 20a, 20b and 20c prevent cracks caused by a thermal stress in the solder. In this embodiment, the occupied area for the electrical component increases slightly due to the protruding terminals.

Figure 8A:
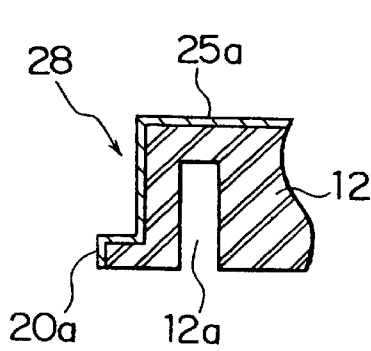
FIG. 8A is an enlarged partial, cross-sectional view of a component modified from the component of FIG. 7.

FIG. 8A shows a modified configuration of the protruding terminals for alleviating the increase of the occupied area by the electrical component due to the protruding terminals shown in FIG. 7. The body 12 in FIG. 8A has a protrusion 28 protruding from the top surface at each opposite side surfaces of the body 12. The protrusion 28 has a first portion extending from the top surface parallel to the surface of the printed circuit board, a second portion extending downward from the first portion and a third portion extending from the second portion parallel to the surface of the printed circuit board in contact therewith. A terminal, for example, terminal 20a is formed on the surface of the protrusion 20. The protrusion 20 provides a sufficient flexibility between the body 12 and the printed circuit board with a small increase of the chip area.

Figure 8B:
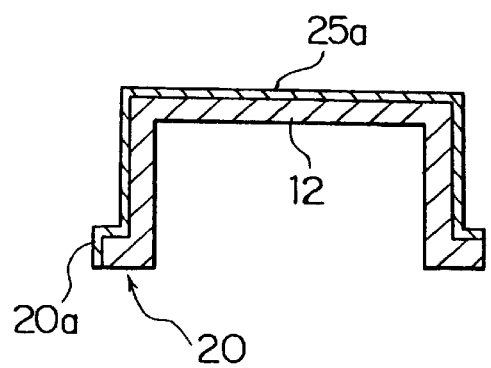
FIG. 8B is a cross-sectional view of a component further modified from the component of FIG. 8A.

Alternatively, the body 12 may have a configuration shown in FIG. 8B, wherein the chip body 12 is formed as a hollow body or a vessel having a bottom opening opposed to the printed circuit board. The small thickness region has a thickness smaller than the thickness of the vessel.

Figure 9:
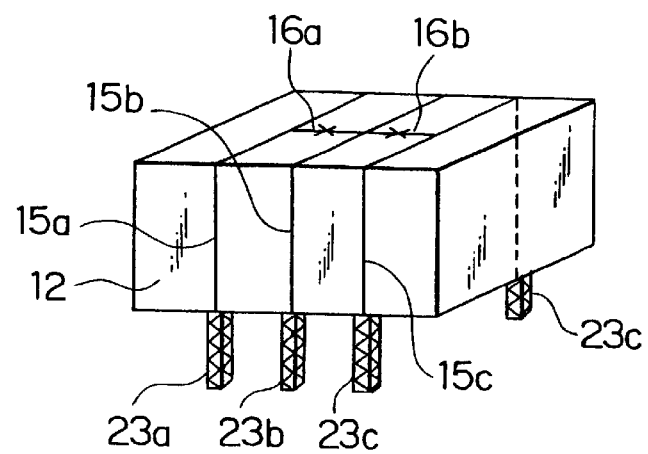
FIG. 9 is a perspective view of a component having a selective cut-off conductor according to a third embodiment of the present invention.

FIG. 9 shows an electrical component according to a third embodiment of the present invention. The component of the present embodiment is similar to the first embodiment except that a plurality of pairs of lead terminals 23a, 23b and 23c are disposed on the edge portion of the bottom surface of the body 12 and both the ends of the first interconnects 15a, 15b and 15c extend to the lead terminals on the bottom surface. The lead terminals extend vertically into throughholes formed on the surface of a printed circuit board for connection by soldering. Each of the lead terminals is plated by a metallic film which is connected to the corresponding first interconnect. In this embodiment, the second interconnects 16a and 16b can be selectively cut-off similarly to the first embodiment.

Figure 10:
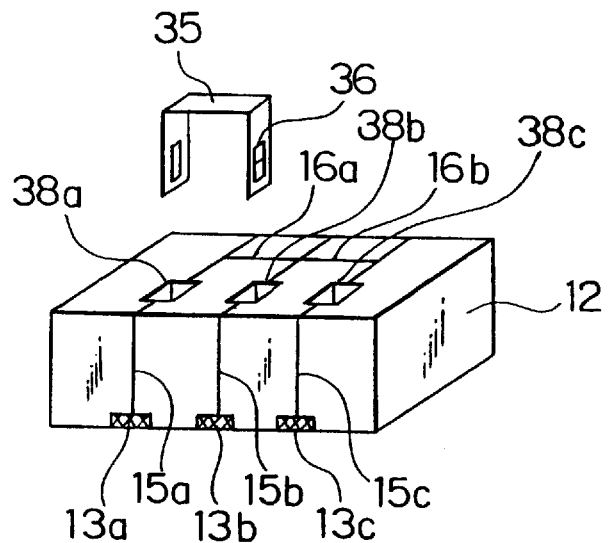
FIG. 10 is a perspective view of a component having a selective cut-off conductor according to a fourth embodiment of the present invention.

FIG. 10 shows an electrical component according to a fourth embodiment of the present invention together with a stripe jumper conductor 35. The component of the present embodiment is similar to the first embodiment except that the body 12 of the present embodiment has a plurality of elongated holes 38a, 38b and 38c each having a rectangular cross-sectional area and formed on a corresponding one of the first interconnects 15a, 15b and 15c on the top surface. The elongated holes 38a, 38b and 38c are plated inside the holes by a metal which is electrically connected to the respective first interconnects 15a, 15b and 15c. The first interconnects 15a, 15b and 15c are disposed at a constant pitch so that each pair of elongate holes among the plurality of holes 38a, 38b and 38c are disposed at the constant pitch. The stripe jumper conductor 35 having a pair of legs and a central bridge portion connecting both the legs is prepared before selective cutting-off of the second interconnects 16a and 16b. The surface of the stripe jumper conductor 35 is treated as by plating by a metal.

If one of the selective cut-off portions is broken by an error in the fourth embodiment, the pair of legs of the jumper conductor 35 are inserted into the respective pair of elongated holes for recovering the connection between the disconnected first interconnects. This configuration of the body 12 enables the avoidance of replacement of the component from the printed circuit board if an erroneous disconnection occurs. The jumper conductor 35 is made of a stripe metallic plate which is bent to have a spring function between the legs. Each of the legs has a contact 36, which is formed by raising a portion of the leg after slitting, from the outer surface of the leg to assure the electric contact between the leg and the inner wall of the elongate hole 38a, 38b or 38c.

Figure 11:
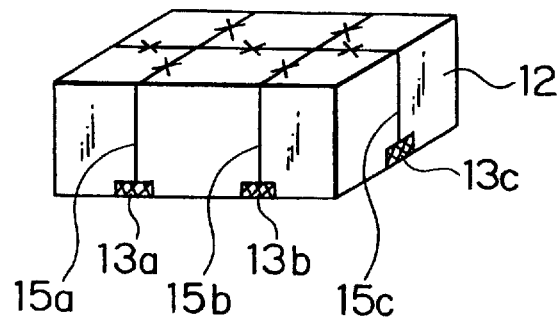
FIG. 11 is a perspective view of a component having a selective cut-off conductor according to a fifth embodiment of the present invention.

FIG. 11 shows an electrical component according to a fifth embodiment of the present invention. The component of the present embodiment is similar to the first embodiment except that the second interconnects 16a and 16b in the first embodiment are replaced by one of the first interconnects, i.e., interconnect 15c, to form a net of the first interconnects 15a, 15b and 15c in the present embodiment and that a selective cut-off portion, as shown by "x", is disposed on each branch of the net of the first interconnects 15a, 15b and 15c. By this configuration, the component can be used in a wide variety of electronic devices due to the wide variety of the selected cut-off portions. The plurality of selective cut-off portions can be broken by a single thrust step by using a plurality of thrusting tools arranged on a single head. The fifth embodiment enables the reduction of the size and/or type of the component. The chip component of the fifth embodiment may have a larger number of first interconnects and corresponding terminals and/or may have elongated holes shown in FIG. 10.

Figure 12:
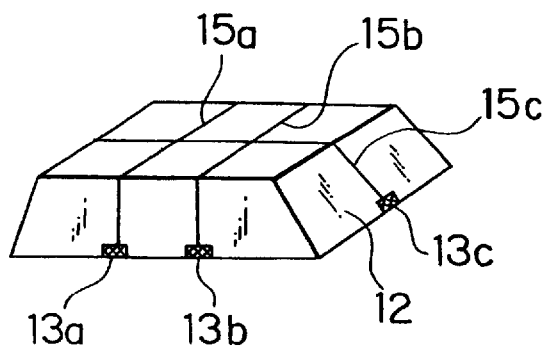
FIG. 12 is a perspective view of a component having a selective cut-off conductor according to a sixth embodiment of the present invention.

FIG. 12 shows an electrical component according to a sixth embodiment of the present invention. The component has a configuration similar to the fifth embodiment except for the shape of the body 12 and fabrication method of the metallic pattern. The body 12 is of a truncated pyramid shape and the metallic pattern is formed by a photolithographic technique.

Figure 13:
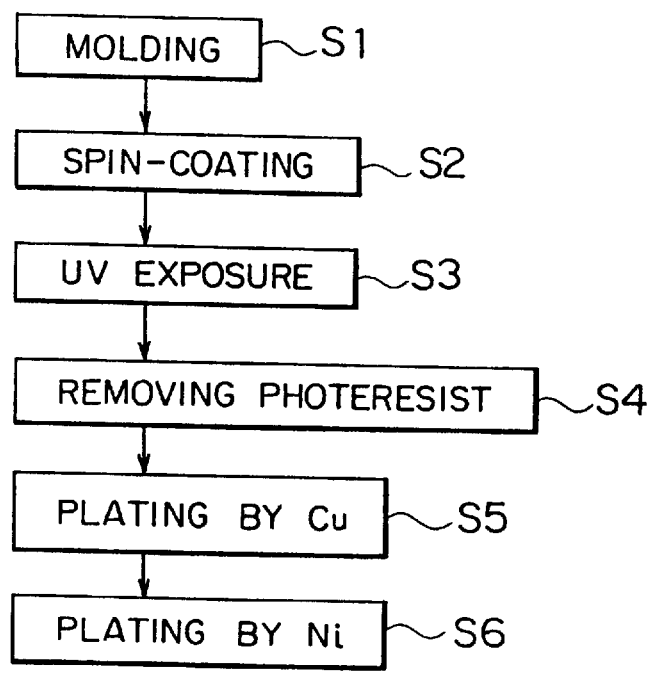
FIG. 13 is a flowchart for exemplarily showing a method for manufacturing the component of FIG. 12.

Referring to FIG. 13 showing a flowchart of a method for manufacturing the component of FIG. 12, the method includes a first step of forming a body by injection molding a resin capable of being plated by metal (S1). The method further includes the steps of spin-coating a photoresist onto the entire surface of the body except for the bottom surface (S2), exposing the photoresist by a UV light except for the portion for the metal pattern (S3), removing the photoresist at portions other than the exposed photoresist to form a photoresist pattern (S4), first plating the exposed surface of the body by copper (Cu) using an electrodless plating method (S5), and second plating the surface of the Cu by nickel (Ni) (S6).

The truncated pyramid shape of the body 12 of the present embodiment enables a single step of UV exposure from above the body 12 onto the top and side surfaces of the body 12. The step S5 of first plating may include, in addition to the recited electrodless plating, an additional electrolytic plating by Cu to form a thicker Cu film. The step S6 of second plating may be omitted in a usual case. Alternatively, the step S6 of second plating may include, in addition to the recited plating by Ni, plating by gold (Au) for a reliable contact. In the latter case, the stripe jumper conductor as used in the fourth embodiment should also be plated by Au.

The electrical component of the present invention comprises a jumper lead for providing a reliable connection between interconnects formed on a printed circuit board etc., and provides a changeover function after soldering. The component may also have circuit elements such as a resistor, a capacitor or a switch in addition to the jumper lead.

Although the present invention is described with reference to preferred embodiments thereof, the present invention is not limited thereto and it will be apparent from those skilled in the art that various modifications or alterations can be easily made therefrom without departing from the scope of the present invention as set forth in the appended claims.

What is claimed is:

1. An electrical component comprising a body substantially made of a single material and having a top surface, bottom surface and a side surface, and a metallic pattern including a plurality of terminals formed on or in the vicinity of said bottom surface and a plurality of interconnects formed at least on said top surface and electrically connected to said terminals, said body having a small thickness region on said top surface in alignment with one of said interconnects, said small thickness region having a thickness smaller than a thickness of adjacent regions adjacent to said small thickness region.

2. An electrical component as defined in claim 1 wherein said metallic pattern is formed by plating.

3. An electrical component as defined in claim 1 wherein said body comprises the shape of a rectangular prism.

4. An electrical component as defined in claim 1 wherein said body has a plurality of holes each disposed for a corresponding one of said plurality of interconnects, said holes having a conductive inner surface electrically connected to the corresponding one of said plurality of interconnects.

5. An electrical component as defined in claim 1 wherein said plurality of interconnects are electrically connected together.

6. An electrical component as defined in claim 1 wherein said body comprises the shape of a truncated pyramid.

7. An electrical component as defined in claim 1 wherein said top surface has a pair of notches corresponding to said small thickness region.

8. An electrical component as defined in claim 3 wherein said terminals includes a pair of terminals, each pair being disposed on opposite side surfaces of said rectangular prism and connected by another of said interconnects.

9. An electrical component as defined in claim 8 wherein said plurality of interconnects include at least three of said interconnects.

10. An electrical component as defined in claim 6 wherein said metallic pattern is formed by photolithographic technique.

11. An electrical component comprising a body having a top surface, bottom surface and a side surface, and a metallic pattern including a plurality of terminals formed on or in the vicinity of said bottom surface, a plurality of first interconnects each extending at least on said top surface and side surface to connect two of said plurality of terminals together and at least one second interconnect formed on said top surface to connect two of said first interconnects, said body having a small thickness region on said top surface in alignment with said second interconnect, said small thickness region having a thickness smaller than a thickness of adjacent regions adjacent to said small thickness region.

* * * * *